United States Patent
Tanaka et al.

(10) Patent No.: US 6,512,368 B2
(45) Date of Patent: Jan. 28, 2003

(54) DEWAR AND BIOLOGICAL MAGNETISM MEASUREMENT APPARATUS USING THE DEWAR

(75) Inventors: Hiroyuki Tanaka, Chiyoda-machi (JP); Norihide Saho, Tsuchiura (JP); Hitoshi Sasabuchi, Mito (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/771,659

(22) Filed: Jan. 30, 2001

(65) Prior Publication Data
US 2001/0040447 A1 Nov. 15, 2001

(30) Foreign Application Priority Data
Feb. 3, 2000 (JP) .......................................... 2000-32622

(51) Int. Cl.⁷ .................. G01R 33/035; F17C 11/00
(52) U.S. Cl. .................. 324/248; 62/46.1; 62/51.1; 327/528; 505/846; 600/409
(58) Field of Search ................. 324/218, 261, 324/232; 62/46.1, 48.2, 48.3, 51.1; 505/846; 327/527, 528; 257/31; 600/409

(56) References Cited
U.S. PATENT DOCUMENTS

| | | | | |
|---|---|---|---|---|
| 4,079,730 A | * | 3/1978 | Wikswo, Jr. et al. | 600/504 |
| 4,766,741 A | * | 8/1988 | Bartlett et al. | 62/51.2 |
| 4,796,432 A | * | 1/1989 | Fixsen et al. | 62/51.1 |
| 4,986,077 A | | 1/1991 | Saho et al. | 62/52.1 |
| 5,346,570 A | * | 9/1994 | Warden et al. | 156/91 |
| 5,845,500 A | * | 12/1998 | Podney | 62/48.3 |
| 5,956,957 A | * | 9/1999 | Lowry et al. | 62/51.1 |
| 6,023,633 A | * | 2/2000 | Kado | 600/409 |

FOREIGN PATENT DOCUMENTS

JP 11-233839 8/1999 ........... H01L/39/04

* cited by examiner

Primary Examiner—Edward Lefkowitz
Assistant Examiner—Darrell D Kinder
(74) Attorney, Agent, or Firm—Mattingly, Stanger & Malur, P.C.

(57) ABSTRACT

A dewar for SQUID is provided. In the dewar for SQUID, an amount of leak gas discharged from absorbent arranged in the upper portion higher than the liquid surface level of liquid helium is small even if the liquid surface level of the liquid helium is lowered. In order to attain the above object, a dewar in accordance with the present invention comprises an inner container for holding a SQUID magnetometer and a coolant, the inner container being made of a non-magnetic and electrically non-conductive material; an outer container for forming a thermal insulating space between the inner container and the outer container, the outer container being made of a non-magnetic and electrically non-conductive material; and a gas absorber provided inside the thermal insulating space, and the dewar further comprises a non-magnetic thermal conductor in contact both with the gas absorber arranged at a level higher than a level of a holding position of the SQUID magnetometer and with a position of the inner container at a level lower than a level of the gas absorber.

6 Claims, 3 Drawing Sheets

DEWAR AND BIOLOGICAL MAGNETISM MEASUREMENT APPARATUS USING THE DEWAR

BACKGROUND OF THE INVENTION

The present invention relates to a structure of a dewar for SQUID which keeps a SQUID magnetometer at a cryogenic temperature.

In recent years, a high sensitive magnetism measurement apparatus using a SQUID (Superconducting Quantum Interference Device) is used for measuring a very weak magnetic field produced from a living body or the like. The SQUID magnetism measurement apparatus can measure a very weak biomagnetic field produced from a brain or a heart, and position of a current source producing the magnetic field can be estimated from the distribution of the biomagnetic field. Therefore, the magnetism measurement apparatus has attracted considerable attention as a medical equipment for diagnosing and determining a function of brain or a function of heart.

The SQUID is a magnetic-electric converting element operated under a superconducting state, and a magnetic sensor using the SQUID is cooled down to a cryogenic temperature using liquid helium or the like in a dewar. A conventional dewar for SQUID is disclosed in Japanese Patent Application Laid-Open No. 11-233839.

In a case where a very weak magnetic field is measured using the SQUID magnetometer, if an eddy current is generated in an inner container for holding the SQUID magnetometer and the liquid helium or an outer container for forming a vacuum enclosure between the inner container and the outer container due to the measured magnetic field or an environment magnetic field, the eddy current ill affects the measured magnetic field. Therefore, the inner container and the outer container of the dewar for SQUID is made of a non-magnetic and non-conductive material, for example, made of FRP (glass-fiber reinforced epoxy resin), and assembled by being adhered with a polymer.

In a conventional dewar made of stainless steel used for cooling a superconducting magnet or the like, helium gas does not penetrate through the wall of the dewar, and leakage of helium gas can be prevented through a joint by welding the joined portion. Therefore, the helium penetration itself has not been treated as an important issue. However, in the FRP dewar, helium gas penetrates through the FRP wall due to the material property of FRP. That is, the helium gas in the inner container penetrates through the wall of the inner container to be discharged into the vacuum enclosure. Since the helium gas discharged into the vacuum enclosure (leak helium gas) reduces the degree of vacuum of the vacuum enclosure, the thermal insulating performance of the vacuum enclosure is deteriorated. That is, evaporation of the liquid helium in the inner container causes to deteriorate the thermal insulating performance, the amount of heat transfer into the liquid helium from the external is increased, and the evaporating amount of the liquid helium is further increased. Therefore, the liquid helium evaporates in a short time, and the SQUID magnetometer is exposed above the liquid surface of the helium to be broken down, which makes the magnetism measurement impossible.

In conventional technology, in order to solve the above problem, the decrease of vacuum degree in the vacuum enclosure is prevented by arranging an absorbent (activated charcoal or the like) capable of absorbing helium gas at a temperature below 20 K in the vacuum enclosure in the outer periphery of the inner container of the dewar to absorb the leak helium gas.

When the magnetism measurement apparatus is being operated for a long time period, the liquid helium evaporates to lower the surface level of the liquid helium. In such a case, the wall surface temperature of the inner container above the level of the liquid helium surface in the inner container is increased above 20 K due to heat entering from parts of the room temperature, and the temperature of the absorbent arranged in the corresponding portion is also increased above 20 K. Therefore, the temperature of the absorbent arranged in the portion above the level of the liquid helium surface exceeds the limit temperature capable of absorbing helium gas, and the leak helium gas absorbed to the absorbent is again discharged into the vacuum enclosure. On the other hand, since the wall surface of the inner container below the level of the liquid helium surface in the inner container is continued to be cooled at a temperature below 20 K by the liquid helium, the absorbent arranged in the corresponding position absorbs the leak helium gas discharged from the absorbent arranged above the level of the liquid helium surface. That is, the absorbent arranged below the level of the liquid helium surface re-absorbs the helium gas discharged from the absorbent arranged above the level of the liquid helium surface, and as the result the degree of vacuum of the vacuum enclosure is maintained.

However, since the liquid helium evaporates in a short time, liquid helium needs to be supplied every time interval. That is, since the process of lowering the surface level of the liquid helium described above (the process that the absorbent in the lower portion absorbs the leak helium gas which the absorbent in the upper portion has absorbed) repetitively occurs every cycle of supplying liquid helium, the absorbent in the lower portion reaches the limit of helium absorption power to be brought in the saturation condition. In that state, when liquid helium is supplied so that the liquid surface of the liquid helium reaches a position of the unsaturated absorbent in the upper portion, the absorbent in the upper portion is cooled down to a temperature lower than 20 K to absorb the leak helium, and accordingly the pressure in the vacuum enclosure is decreased to recover the thermal insulating performance and the evaporating amount of the liquid helium is returned to the original state. However, when the liquid surface of the liquid helium is brought to a level below the top end position of the saturated absorbent region, the degree of vacuum is decreased to increase the evaporating amount of the liquid helium. That is, the evaporating rate of the liquid helium is kept to the initial value when the liquid surface of the liquid helium is above the top end position of the saturated absorbent region, but the evaporating rate of the liquid helium is increased to rapidly consume the liquid helium when the liquid surface of the liquid helium is below the top end position of the saturated absorbent region.

Further, by repeating the process described above, the top end position of the saturated absorbent region is further raised, and consequently the evaporating period of liquid helium is further shortened. As the evaporating period of liquid helium is shortened and number of liquid helium supply times is increased, number of occasions of causing expensive liquid helium to evaporate is further increased due to entering of heat at liquid helium supplying work.

SUMMARY OF THE INVENTION

An object of the present invention is to provide a dewar for SQUID in which an amount of leak gas discharged from absorbent arranged in the upper portion higher than the liquid surface level of liquid helium is small even if the liquid surface level of the liquid helium is lowered, and accordingly the cycle of supplying liquid helium can be kept long for a long time, and to provide a biological magnetism measurement apparatus using the dewar for SQUID.

In order to attain the above object, a dewar in accordance with the present invention comprises an inner container for holding a SQUID magnetometer and a coolant, the inner container being made of a non-magnetic and electrically non-conductive material; an outer container for forming a thermal insulating space between the inner container and the outer container, the outer container being made of a non-magnetic and electrically non-conductive material; and a gas absorbing means provided inside the thermal insulating space, and the dewar further comprises a non-magnetic thermal conducting means in contact both with the gas absorbing means arranged at a level higher than a level of a holding position of the SQUID magnetometer and with a position of the inner container at a level lower than a level of the gas absorbing means.

By the structure described above, since the thermal conducting means is in contact with a position of the inner container at a level lower than the gas absorbing means even if the coolant held in the inner container evaporates to lower the liquid surface of the coolant in the inner container, the gas absorbing means can be maintained at a temperature of the coolant held in the inner container by the thermal conducting means. Accordingly, the gas absorbing power of the gas absorbing means can be maintained.

DESCRIPTION OF THE PREFERRED EMBODIMENTS

EMBODIMENT 1

Figure 1:
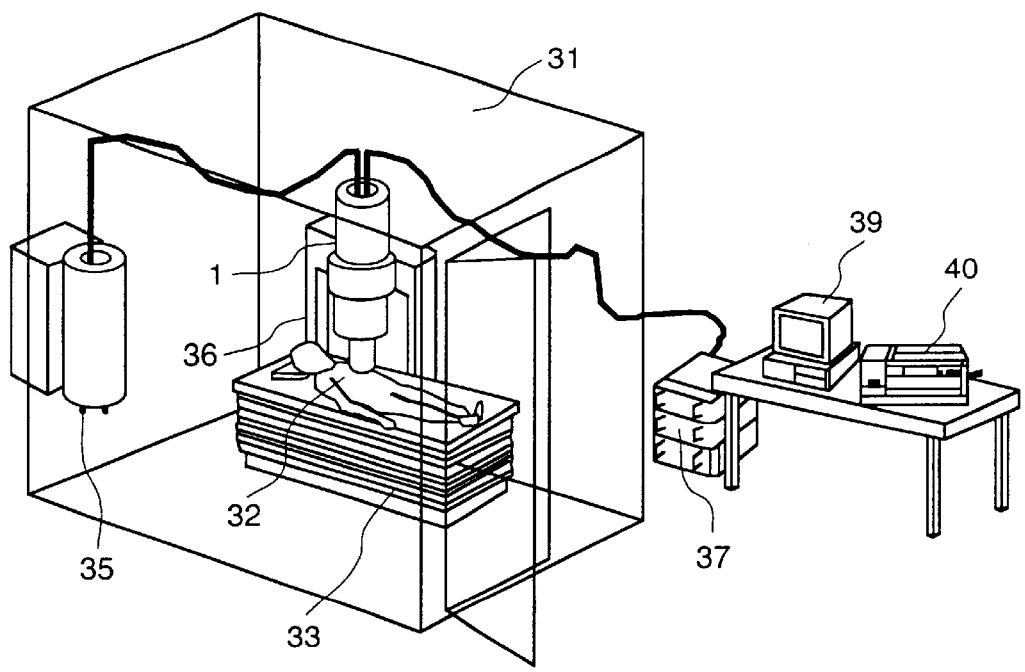
FIG. 1 is a view showing the outward appearance of an embodiment of a heart magnetism measurement apparatus in accordance with the present invention.
Figure 2:
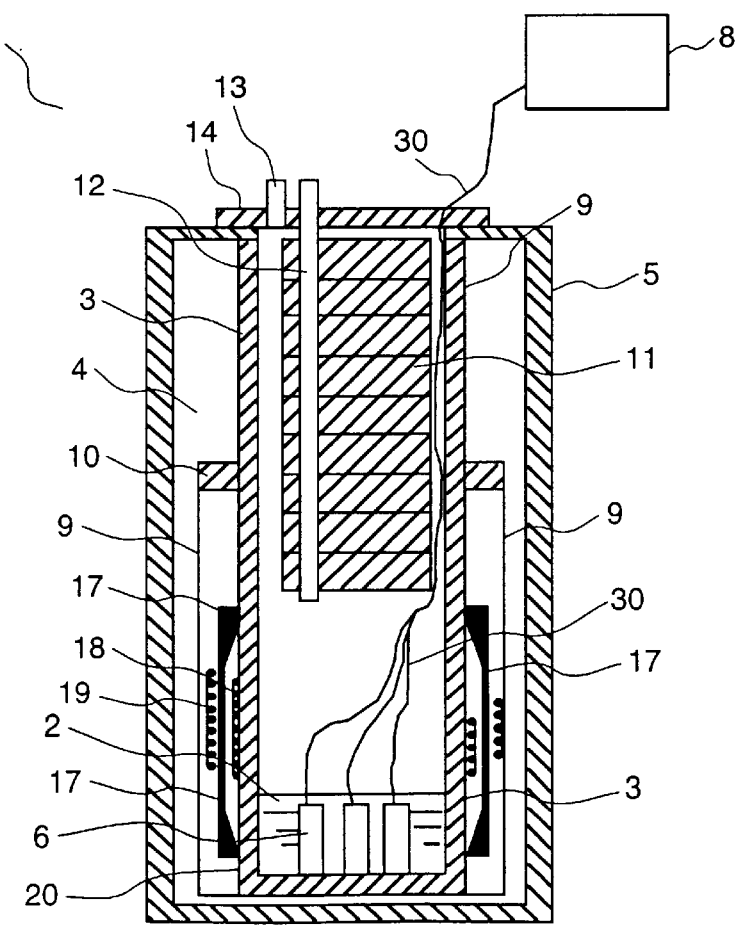
FIG. 2 is a cross-sectional view showing the structure of an embodiment of a dewar in accordance with the present invention.
Figure 3:
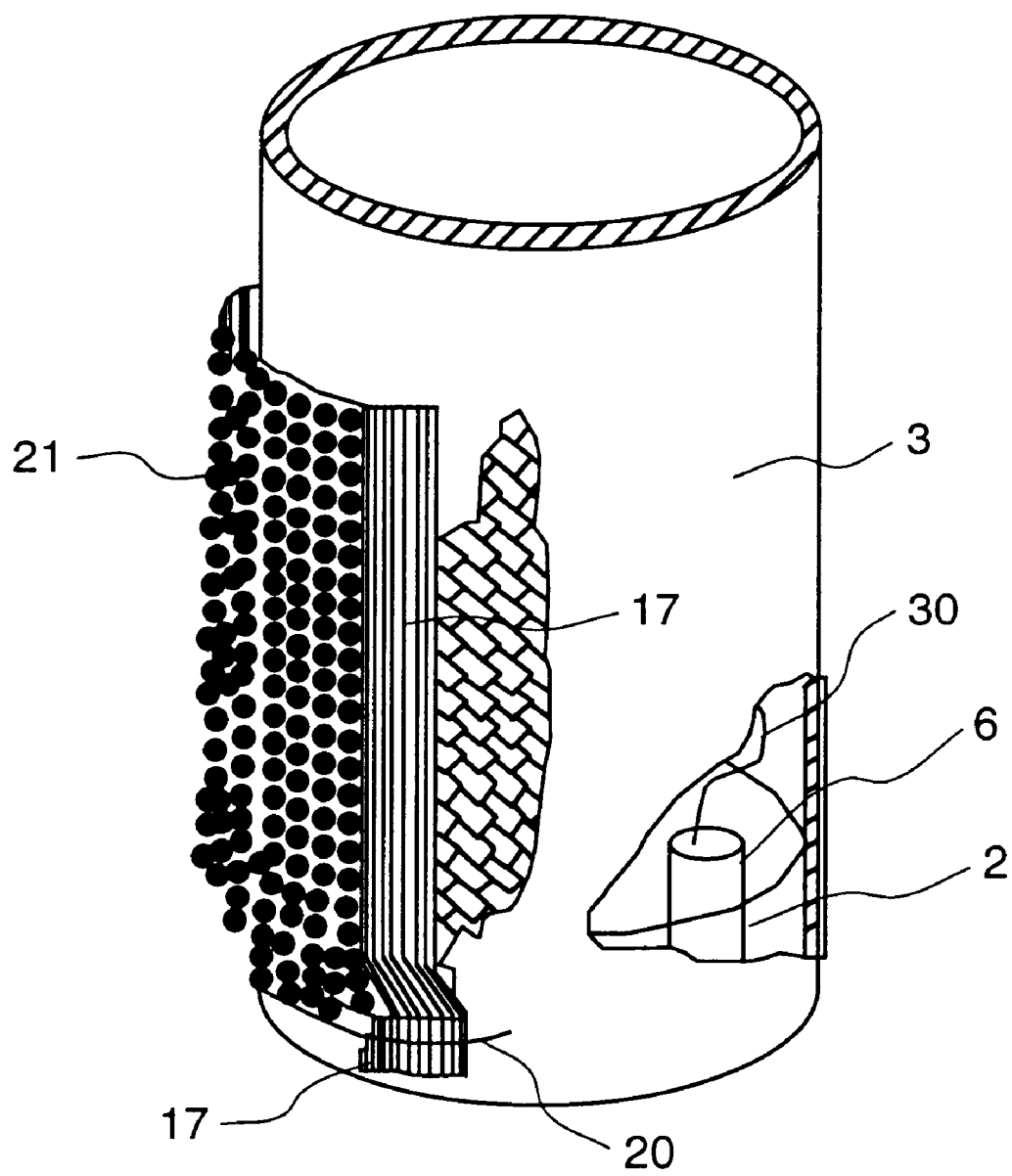
FIG. 3 is a view showing the constitution of a cooling plate used for the embodiment of the dewar in accordance with the present invention.
Figure 4:
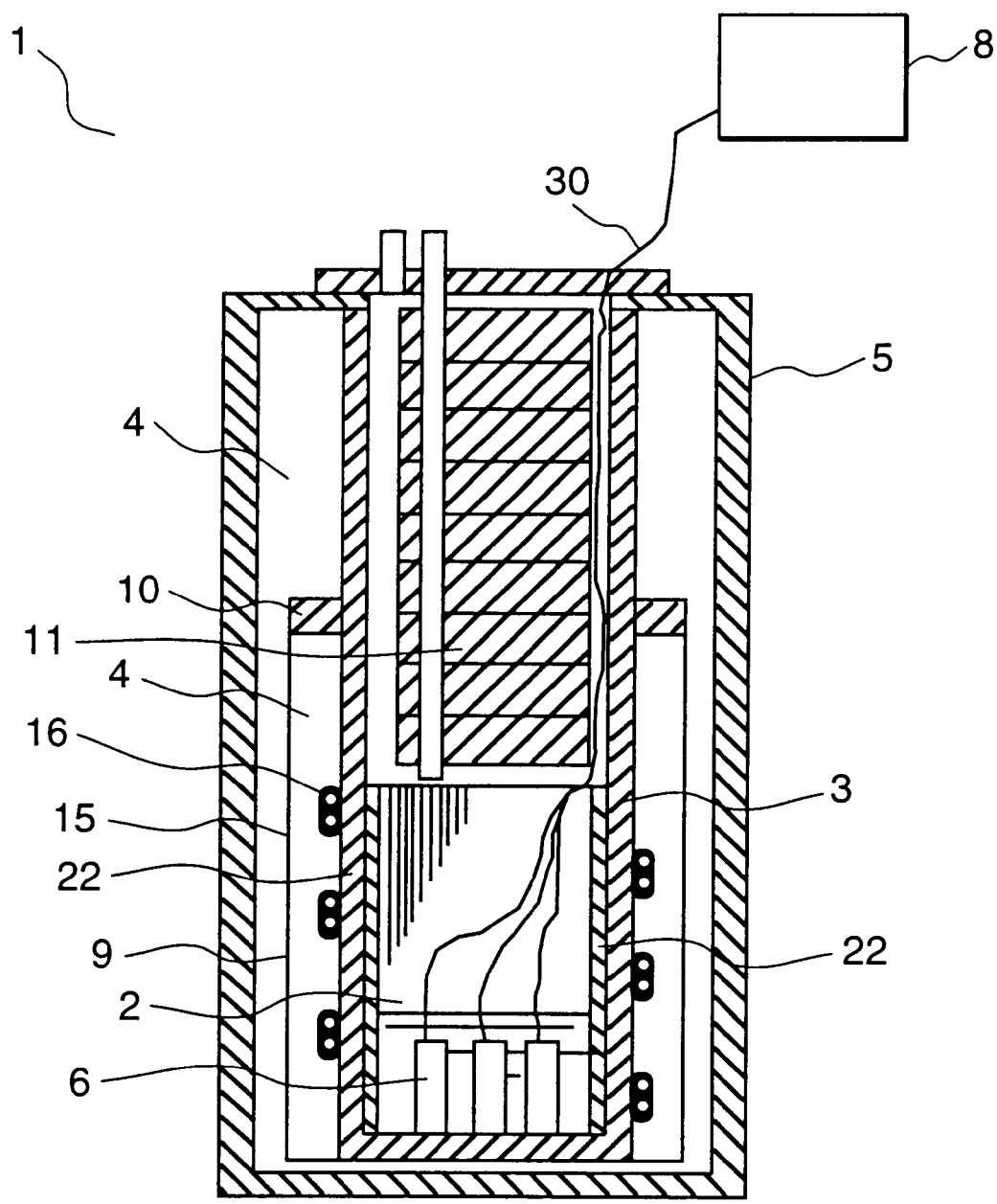
FIG. 4 is a cross-sectional view showing the structure of a second embodiment of a dewar in accordance with the present invention.

FIG. 1 is a view showing the outward appearance of an embodiment of a heart magnetism measurement apparatus in accordance with the present invention. FIG. 2 is a cross-sectional view showing the structure of an embodiment of a dewar in accordance with the present invention. FIG. 3 is a view showing the constitution of a cooling plate used for the embodiment of the dewar in accordance with the present invention. FIG. 4 is a cross-sectional view showing the structure of a second embodiment of a dewar in accordance with the present invention.

Initially, the outline of the system will be described in taking the embodiment of the heart magnetism measurement using SQUID in accordance with the present invention, referring to FIG. 1. The magnetocardiogram system is composed of a magnetic shield room 31, a dewar 1, a gantry 36, a bed 33, an automatic supply unit 35, a measurement control circuit 37, a computer 39 and a printer 40. Since a heart magnetic field signal to be measured is very weak, the detecting part including SQUID magnetic sensors is installed inside the magnetic shield room 31 in order to remove an effect of environmental magnetic noise in the background. The measurement is performed in a state that a reagent 32 of measured object is lying on the bed 33 on his back. The measured surface of the reagent (in a case of measuring the chest, the measured surface is generally parallel to the wall of the chest) is nearly in parallel to the surface of the bed 33. The dewar 1 filled with liquid helium of coolant is arranged above the chest of the reagent, and the dewar 1 contains the plurality of SQUID magnetic sensors. The liquid helium is continuously supplied from the automatic supply unit 35 arranged outside of the magnetic shield room 31. The SQUID outputs a voltage in specific relation with an intensity of a heart magnetic field (it may be regarded as a magnetic flux density) generated from the reagent 32, and the output is input to the measurement control circuit 37. The measurement control circuit 37 is constructed in that change in the heart magnetic field input to the SQUID is canceled by a negative feedback circuit including a feedback coil to the SQUID so as to maintain the output of the SQUID magnetic sensors constant (this is called as magnetic lock). By converting the current conducting the feedback coil into a voltage, the voltage output in the specific relation with the change in the heart magnetic field signal can be obtained. Since the detecting method through the feedback coil is employed as described above, the voltage output signal in proportion to the change in the heart magnetic field signal can be obtained. The output voltage is sampled by an analogue-to-digital converter through an amplifier/filter in the measurement control circuit 37, and then input to the computer 39. The computer 39 is composed of a personal computer and a display unit, and processes the input heart magnetic field signal to output and display the result in a form of a time waveform chart, an isomagnetic line map or the like. Further, the computer 39 can calculate a position of a current source from the sampled heart magnetic field signal to display it on the map. Although number and arrangement of the SQUID magnetic sensors mounted in the dewar 1 may be arbitrary, the SQUID magnetic sensors are arranged in an 8-by-8 matrix in this embodiment. Furthermore, the SQUID magnetic sensors are placed so that the longitudinal direction of the SQUID magnetic sensor agrees with the direction normal to the measurement face.

Next, the structure of a first embodiment of the dewar 1 in accordance with the present invention will be described below, referring to FIG. 2. As shown in FIG. 2, the dewar 1 is composed of SQUID magnetic sensors 6 made of a material such as NbTi, Nb or the like which turns to the superconducting state at the critical temperature lower than about 7 K (for example, liquid helium temperature under atmospheric pressure of 4.2 K); an inner container 3 holding liquid helium 2 for cooling the SQUID magnetic sensors 6 down to cryogenic temperature; an outer container 5 for surrounding the inner container 3 and forming a vacuum enclosure 4 between the inner container 3 and the outer container 5; a flange 14 for sealing the inner container 3 from the external air; and measurement lead wires 30 for leading measured signals from the SQUID magnetic sensors to the outside of the inner container 3. In order to prevent eddy current from being generated by the measured magnetic field so as to not affect the measured magnetic field, the inner container 3 and the outer container 5 are made of a non-magnetic and non-conductive material such as glass epoxy resin or the like. The measurement lead wires 30 are connected to a measurement control circuit 37, and the measurement unit 8 calculates a magnetic field distribution, a magnetic field generating current distribution and so on from the measured values, and executes imaging processing. Inside the vacuum enclosure 4, a thermal shield plate 9 for preventing radiant heat from outer container into the inner container 3 is arranged so as to surround the inner container 3. The thermal shield plate 9 is cooled by being thermally united with the inner container 3 through a flange 10 in a low temperature part of the upper part of the inner container 3. Further, the thermal shield plate 9 is composed of rectangular copper plates or small diameter enamel coated copper wires so that eddy current causing noises is hardly generated by fluctuations of a magnetic field from the external. Furthermore, in order to prevent entering of radiant heat from the outer container 5, a laminated thermal insulating member (not shown) such as an aluminum mylar or the like is wound around the outer part of the thermal shield plate 9. On the other hand, in a space in the upper portion of the inner container 3, an insert 11 formed of laminating disk-shaped foamed thermal insulating members made of polyurethane or the like is placed to prevent heat from entering from the upper room temperature portion. Further, a coolant transferring pipe 12 is supported by the flange (lid) 14 and arranged so as to penetrate the insert 11 to supply liquid helium 2 into the inner container 3. Evaporated gas of the liquid helium 2 evaporated by heat entering from the upper room temperature portion is heated while cooling the inner surface of the inner container 3 and the outer surface of the insert 11, and-discharged through an exhaust port 13 supported by the flange (lid) 14 to the atmosphere.

The structure of a cooling plate 17 used for the embodiment of the dewar 1 in accordance with the present invention will be described below, referring to FIG. 3. The cooling plate 17 characterizing the present invention is arranged in the outer peripheral portion of the inner container 3 inside the vacuum enclosure 4. The cooling plate 17 is made of a non-magnetic and high-thermal conductive material (for example, copper). In order to suppress occurrence of eddy current caused by fluctuations of the magnetic field from the external, the cooling plate 17 is formed of a member composed of rectangular copper plates or a member formed by gathering small diameter enamel coated copper wires in a flat-plate shape. Absorbent (granular or sheet-shaped activated charcoal) 21 is bonded onto the outer surface of the cooling plate 17 with an adhesive. The lower portion of the cooling plate 17 is fixed to the outer peripheral portion of the inner container 3 at a level below an arranging height of the superconduction members in the SQUID magnetic sensors 6. Therefore, in the state that the liquid surface level of the liquid helium 2 is higher than the position of the superconducting members, that is, while the SQUID magnetic sensors 6 are functioning, the cooling plate 17 is always cooled to the liquid helium temperature to maintain the absorbing power of the absorbent (granular or sheet-shaped activated charcoal) 21 bonded onto the cooling plate 17. Therein, the cooling plate 17 is fixed to the outer peripheral portion of the inner container 3 with fastening wires 20 and adhered to the outer peripheral portion with an adhesive. Further, the middle portion and the upper portion of the cooling plate 17 are apart from the outer wall surface of the inner container 3 to prevent heat from conducting to the cooling plate 17 from the temperature-rising outer peripheral portion of the inner container 3. The first thermal insulating members 18 in FIG. 2 are arranged between the cooling plate 17 and the inner container 3 to prevent the middle portion and the upper portion of the cooling plate 17 from contacting with the inner container 3. The first thermal insulating member 18 is formed by alternatively laminating a polyester film having an uneven surface and the uneven-surface polyester film having vapor-deposited aluminum on the one surface side.

By the structure, when the liquid helium 2 evaporates and the liquid surface of the liquid helium 2 is lowered down to the bottom end portion of the inner container 3, that is, when the wall temperature of the portion of the inner container 3 above the liquid surface of the liquid helium 2 is increased, the whole cooling plate 17 is maintained the cryogenic temperature of about 7 K near the liquid helium temperature since only the bottom portion of the cooling plate 17 is in contact with the inner container 3 and the other portion is out of contact with the portion of the inner container 3 above the liquid surface of the liquid helium 2 due to the first thermal insulating members 18. Therefore, the gas absorbing power of the absorbent (granular or sheet-shaped activated charcoal) 21 bonded onto the outer surface of the cooling plate 17 is maintained, and accordingly the degree of vacuum in the vacuum enclosure 4 is maintained low enough to keep the thermal insulating performance.

Further, it is preferable that a second thermal insulating member 19 of an uneven-surface polyester film having vapor-deposited aluminum on the one surface side is arranged between the thermal shield plate 9 and the cooling plate 17 to prevent heat from entering into the absorbent (granular or sheet-shaped activated charcoal) 21 on the cooling plate 17 at the cryogenic temperature from the thermal shield plate 9 to increase the temperature of the absorbent (granular or sheet-shaped activated charcoal) 21.

According to the present embodiment, the leak gas absorbed to the absorbent 21 (granular or sheet-shaped activated charcoal) is not discharged because the whole absorbent (activated charcoal) is cooled down to the liquid helium temperature even if the liquid level of the liquid helium 2 is lowered. Therefore, the liquid helium supply period needs not to be shortened even during a long period operation, and accordingly it is possible to suppress increase of the troublesome liquid helium supply work. Further, there is an effect in that a frequency of losing the liquid helium during supplying can be decreased. Furthermore, it is possible to reduce the evaporating amount of the liquid helium because an amount of heat entering through the wall of the inner container 3 by thermal conduction is decreased, and it is also possible to prevent increase in the evaporating amount of the liquid helium due to deterioration of the thermal insulating performance of the vacuum enclosure 4. Therefore, operating cost of the magnetism measurement apparatus can be suppressed low.

EMBODIMENT 2

FIG. 4 is a cross-sectional view showing the structure of a second embodiment of a dewar in accordance with the present invention. This embodiment is different from the first embodiment in the point that a cooling plate 22, which is composed of rectangular copper plates or small diameter enamel coated copper wires so that eddy current causing noises is hardly generated by fluctuations of a magnetic field from the external, is arranged on the inner wall surface of the inner container 3. The top end of the cooling plate is positioned at the same level as the absorbent arranged in the outer periphery of the inner container 3 and the bottom end of the cooling plate 3 is positioned at the level of the superconducting members of the SQUID magnetic sensors.

According to the second embodiment, the bottom end of the cooling plate 22 is immersed below the liquid surface of the liquid helium 2 during the time when the SQUID magnetic sensors 6 are maintained in the superconducting state even if the liquid surface of the liquid helium 2 is lowered. Therefore, the evaporated helium gas in the upper portion above the liquid surface of the liquid helium 2 inside the inner container 3 is also cooled down to the liquid helium temperature. Accordingly, during the time when the SQUID magnetic sensors 6 are maintained in the superconducting state even if the liquid surface of the liquid helium 2 is lowered, the wall surface of the inner container 3 of the cryogenic temperature portion is cooled to the liquid helium temperature level.

On the other hand, since the upper portion of the wall surface of the inner container 3 is cooled to the liquid helium temperature level, the thermal shield plate 9 is also cooled below 20 K as if the case where the liquid surface of the liquid helium existed at the level of the upper position. Therefore, since bags 16 for containing activated charcoal, which are made of Japanese paper and placed on the outer wall surface of the inner container 3 inside the vacuum enclosure 4, are cooled to the liquid helium temperature, the gas absorbing power of the activated charcoal can be maintained. As the result, the vacuum pressure inside the vacuum enclosure 3 is maintained low, and accordingly the thermal insulating performance is not deteriorated.

As described above, according to the second embodiment, the activated charcoal does not discharge the absorbed leak gas because the whole activated charcoal is cooled down to the cryogenic temperature even if the liquid level of the liquid helium is lowered. Therefore, the liquid helium supply period needs not to be shortened even during a long period operation, and accordingly it is possible to suppress increase of the troublesome liquid helium supply work. Further, there is an effect in that a frequency of losing the liquid helium during supplying can be decreased. Furthermore, it is possible to prevent increase in the evaporating amount of the liquid helium due to deterioration of the thermal insulating performance. Therefore, there is an effect that increase of the operating cost of the magnetism measurement apparatus can be prevented.

Although the cooling plate 22 is arranged inside the inner container 3 in this embodiment, the similar effect can be obtained by thermally uniting the cooling plate 22 with the inner container 3 by adhering on the outer side of the inner container 3 with an adhesive, and attaching the activated charcoal onto or winding the bags 16 around the cooling plate.

Further, although the first and the second embodiments have described the cases that the magnetism measurement element is used as the object to be cooled, the similar effect can be attained when element using a superconducting phenomenon such as a Josephson electronic element, a superconducting electronic element for filter, a superconducting magnet or the like is used as the object to be cooled.

According to the present invention, there is the effect that discharge of leak gas from the absorbent placed above the liquid surface of the liquid helium can be reduced even if the liquid surface of the liquid helium is lowered.

What is claimed is:

1. A dewar comprising:
   an inner container for holding a SQUID magnetometer and a coolant, said inner container being made of a non-magnetic and electrically non-conductive material;
   an outer container for forming a thermal insulating space between said inner container and said outer container, said outer container being made of a non-magnetic and electrically non-conductive material;
   a gas absorbing means provided inside said thermal insulating space; and
   a non-magnetic thermal conducting means in contact both with said gas absorbing means arranged at a level higher than a level of a holding position of said SQUID magnetometer and with a position of said inner container at a level lower than a level of said gas absorbing means.

2. A dewar according to claim 1, wherein
   said thermal conducting means is in contact only with a position of said inner container at a level lower than the level of the holding position of said SQUID magnetometer.

3. A dewar according to claim 1, which comprises
   a thermal insulating means between said thermal conducting means and said inner container.

4. A dewar according to claim 1, wherein
   said thermal conducting means is composed of rectangular members or wire-shaped members.

5. A biological magnetism measurement apparatus for measuring a magnetic field produced by a living body, comprising:
   a SQUID magnetometer, and
   a dewar composed of an inner container holding said SQUID magnetometer and a coolant, said inner container being made of a non-magnetic and electrically non-conductive material, an outer container for forming a thermal insulating space between said inner container and said outer container, said outer container being made of a non-magnetic and electrically non-conductive material, and a gas absorbing means provided inside said thermal insulating space,
   wherein said dewar comprises a non-magnetic thermal conducting means in contact both with said gas absorbing means arranged at a level higher than a level of a holding position of said SQUID magnetometer and with a position of said inner container at a level lower than a level of said gas absorbing means.

6. A biological magnetism measurement apparatus according to claim 5, wherein
   said thermal conducting means is composed of rectangular members or wire-shaped members.

* * * * *